(12) United States Patent
Oda et al.

(10) Patent No.: US 6,191,452 B1
(45) Date of Patent: Feb. 20, 2001

(54) THIN FILM TRANSISTOR HAVING A STOPPER LAYER

(75) Inventors: Nobuhiko Oda, Hashima; Shiro Nakanishi, Ohgaki; Shinji Yuda, Ohgaki; Tsutomu Yamada, Ohgaki, all of (JP)

(73) Assignee: Sanyo Electric Co., Ltd., Osaka (JP)

( * ) Notice: Under 35 U.S.C. 154(b), the term of this patent shall be extended for 0 days.

(21) Appl. No.: 09/162,836

(22) Filed: Sep. 29, 1998

(30) Foreign Application Priority Data

Oct. 3, 1997 (JP) .................................................. 9-270893

(51) Int. Cl.$^7$ .................................................... H01L 29/00
(52) U.S. Cl. ......................... 257/347; 257/348; 257/349; 257/350; 257/351; 257/352; 257/353; 284/354; 284/355; 284/59
(58) Field of Search ................................... 252/347–355, 252/59

(56) References Cited

U.S. PATENT DOCUMENTS

| | | |
|---|---|---|
| 5,130,772 | 7/1992 | Choi . |
| 5,296,729 | 3/1994 | Yamanaka et al. . |
| 5,440,168 | 8/1995 | Nishimura et al. . |
| 5,468,986 | 11/1995 | Yamanashi . |
| 5,917,225 | 6/1999 | Yamazaki et al. . |

OTHER PUBLICATIONS

Wolf, Silicon Processing for the VLSI Era, vol. 1, 1986, p. 522.

*Primary Examiner*—Fetsum Abraham
(74) *Attorney, Agent, or Firm*—Cantor Colburn LLP

(57) ABSTRACT

On a transparent substrate to which a gate electrode is arranged, a silicon nitride film and a silicon oxide film to be gate insulating films are deposited, and further, a polycrystalline silicon film as a semiconductor film to be an active region is formed. On the polycrystalline silicon film corresponding to the gate electrode, a stopper is arranged, and a silicon oxide film and a silicon nitride film to be an interlayer insulating films are deposited so as to cover this stopper. The film thickness T0 of the stopper is set in a range of 800 angstroms to 1200 angstroms. Furthermore, the film thickness T0 of the stopper is set in the range to fulfill the following expression:

$$T0 + T1 \leq (T2 \times 8000 \text{ Å})^{1/2}$$

where T1 is the film thickness of the silicon oxide film and T2 is the film thickness of the silicon nitride film.

5 Claims, 5 Drawing Sheets

THIN FILM TRANSISTOR HAVING A STOPPER LAYER

BACKGROUND OF THE INVENTION

1. Field of the Invention

The present invention relates to a thin film transistor suitable as a switching element for a display picture element of an active matrix type display panel or the like.

2. Description of the Related Art

FIG. 1 is a cross sectional view showing the arrangement of a bottom gate type thin film transistor.

Such a thin film transistor is formed as follows:

On the surface of an insulating transparent substrate 1, a gate electrode 2 made of a metal with a high melting point i.e. a refractory metal such as tungsten or chromium is disposed. This gate electrode 2 is tapered so that both end portions are wider on the transparent substrate 1 side. On the transparent substrate 1 to which the gate electrode 2 is arranged, a silicon oxide film 4 is deposited through a silicon nitride film 3. The silicon nitride film 3 prevents the impurities included in the transparent substrate 1 from entering the active region to be described later, and the silicon oxide film 4 functions as a gate insulating film. On the silicon oxide film 4, a polycrystalline silicon film 5 is deposited so as to cross the gate electrode 2. This polycrystalline silicon film 5 is the active region of a thin film transistor.

On the polycrystalline silicon film 5, a stopper 6 made of an insulating material such as silicon oxide is disposed. The region covered by the stopper 6 of the polycrystalline silicon film 5 is a channel region 5c, while the remaining region of the polycrystalline silicon film 5 is a source region 5s and a drain region 5d. On the polycrystalline silicon film 5 to which the stopper 6 is formed, a silicon oxide film 7 and a silicon nitride film 8 are deposited. These silicon oxide film 7 and silicon nitride film 8 are layer to layer insulating films for protecting the polycrystalline silicon film 5 including the source region 5s and the drain region 5d.

In specified places of the silicon oxide film 7 and the silicon nitride film 8 on the source region 5s and the drain region 5d, contact holes 9 are formed. At the portions of these contact holes 9, a source electrode 10s and a drain electrode 10d are arranged, which are connected to the source region 5s and the drain region 5d. On the silicon nitride film 8 to which the source electrode 10s and the drain electrode 10d are disposed, an acrylic resin layer 11 transparent to visible light is deposited. This acrylic resin layer 11 fills up the irregularity produced by the gate electrode 2 or the stopper 6, so that the planarization of the surface may be performed.

In the acrylic resin layer 11 on the source electrode 10s, a contact hole 12 is formed. Then, a transparent electrode 13 made of ITO (Indium Tin Oxide) or the like to be connected to an aluminum electrode 10 through this contact hole 12 is arranged so as to spread over the acrylic resin layer 11. This transparent electrode 13 forms a pixel electrode of a liquid crystal display panel.

A plurality of such thin film transistors are arranged by the matrix layout on the transparent substrate 1 together with the pixel electrode 13, and respectively applies, to the pixel electrode, the image data supplied to the drain electrode 10d, responding to the scanning control signal applied to the gate electrode 2.

In the polycrystalline silicon film 5, it is preferable that the crystal grain diameter thereof be formed of a sufficient size so that the polycrystalline silicon film 5 may function as the active region of a thin film transistor. As a method to form polycrystalline silicon film 5 crystals of sufficiently large grain diameter, laser annealing methods using an excimer laser is well known. In laser annealing, silicon in an amorphous state is deposited on a silicon oxide film 4 to be the gate insulating film, and the silicon is irradiated with the excimer laser so that at one point it melts to consequently crystallize the silicon. When such a laser annealing method is used, it is unnecessary to raise the temperature of the transparent substrate 1, so that a glass substrate with a low melting point can be adopted as the transparent substrate 1.

Polycrystalline silicon films 5 crystallized by laser annealing typically include many crystal defects. As electrons moving in the film may then easily be captured, it is not preferable that such a polycrystalline silicon film 5 be made to be the active region of a transistor. Therefore, on the once formed polycrystalline silicon film 5, an insulating film including many of hydrogen ions (hydrogen atoms) is formed, and, by performing the annealing together with that insulating film in the atmosphere of nitrogen, the crystal defects are filled with hydrogen ions (hydrogen atoms).

Silicon nitride film is a well known insulating film including any hydrogen ions and a source of hydrogen ions for the polycrystalline silicon film 5. As shown in FIG. 1, it is often disposed that an interlayer insulating film comprises a silicon nitride film 8. However, as the stopper 6 used as a mask during the doping of ions is disposed on the channel region 5c of the polycrystalline silicon film 5, a problem is created that it is difficult for the hydrogen ions supplied from the silicon nitride film 8 to reach the channel region 5c. As for this stopper 6, if the film thickness is made thinner so that the hydrogen ions may be permeable, the stopper 6 does not function as a mask during the doping of ions in some cases, and film thickness is, to some extent, necessary.

SUMMARY OF THE INVENTION

Therefore, an object of the present invention is to optimize the film thickness of a stopper so that hydrogen ions may effectively be supplied to a semiconductor film from an interlayer insulating film, and so that the stopper may function as a mask during ion doping.

A thin film transistor of the present invention comprises a substrate; a gate electrode disposed on one main surface of said substrate; a gate insulating film deposited on said substrate so as to cover said gate electrode; a semiconductor film deposited on said gate insulating film so as to lie across said gate electrode; a stopper disposed on said semiconductor film so as to overlap with said gate electrode; and an interlayer insulating film deposited on said semiconductor film, wherein said stopper is made of a silicon oxide film with a film thickness of 800 angstroms to 1200 angstroms.

Furthermore, in said thin film transistor, said interlayer insulating film may comprise a silicon oxide film contacting said semiconductor film, and a silicon nitride film formed on the silicon oxide film.

Moreover, the total film thickness of said stopper and said silicon oxide film may be set so as to be a value equal or less than the square root of the value determined by multiplying the film thickness of said silicon nitride by 8000 angstroms.

More preferably, the total film thickness of said stopper and said silicon oxide film may be set so as to be a value equal or less than the square root of the value determined by multiplying the film thickness of said silicon nitride by 4000 angstroms.

Furthermore, another aspect of the present invention is a manufacturing method of a thin film transistor, comprising a first step of forming a refractory metal film on one main surface of a substrate and of forming a gate electrode by etching this refractory metal film into a specified pattern; a second step of depositing a gate insulating film on said substrate so as to cover said gate electrode and of depositing a semiconductor film on this gate insulating film; a third step of forming an insulating layer with a predetermined film thickness on said semiconductor film and of forming a stopper by this insulating layer into a pattern corresponding to said gate electrode; a fourth step of depositing an interlayer insulating film on said semiconductor film so as to cover said stopper; and a fifth step of heating said semiconductor film and said interlayer insulating film to a predetermined temperature and of introducing the hydrogen ions included in said interlayer insulating film into said semiconductor film, wherein said third step includes a step of depositing the silicon oxide film to have a film thickness of 800 angstroms to 1200 angstroms.

According to the present invention, the film thickness of the stopper on the semiconductor film is disposed to lie within the range of 800 angstroms to 1200 angstroms, so that the hydrogen ions which are supplied from the interlayer insulating film in sufficient quantity to fill the crystal defects of the semiconductor film, may reach the semiconductor film. At the same time, ion doping to the semiconductor film can be stopped.

That is, according to the present invention, hydrogen ions (hydrogen atoms) are effectively supplied to the polycrystalline silicon film forming the active region from the interlayer insulating film, and by a brief, low temperature processing, the crystal defects in the active region can be filled. Furthermore, during the etching processing, the shape of the pattern of the stopper can accurately be formed, and, when the source and drain regions are formed using this stopper as a mask, the effective channel width and the effective channel length of a transistor can be formed to specified sizes.

DESCRIPTION OF THE PREFERRED EMBODIMENTS

Figure 1:
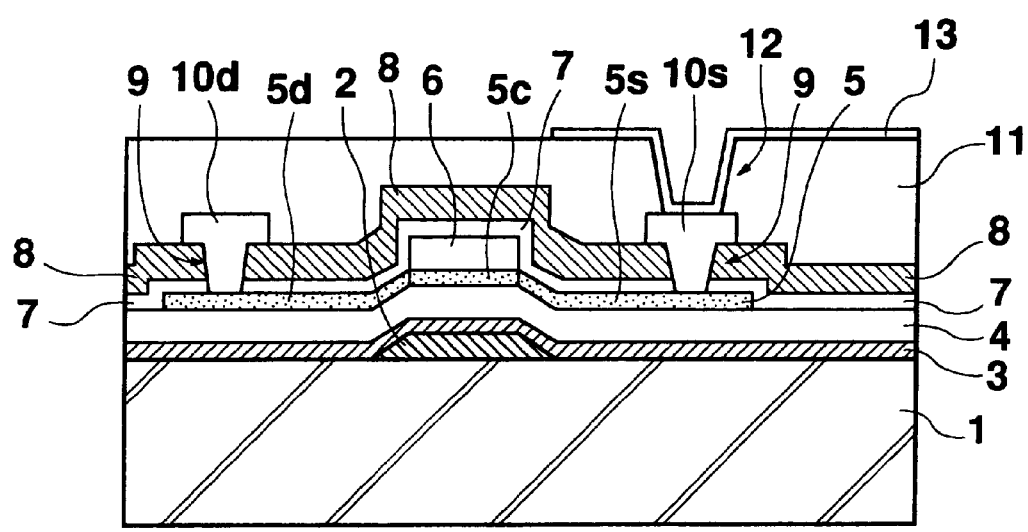
FIG. 1 is a cross sectional view showing the arrangement of a conventional thin film transistor.
Figure 2:
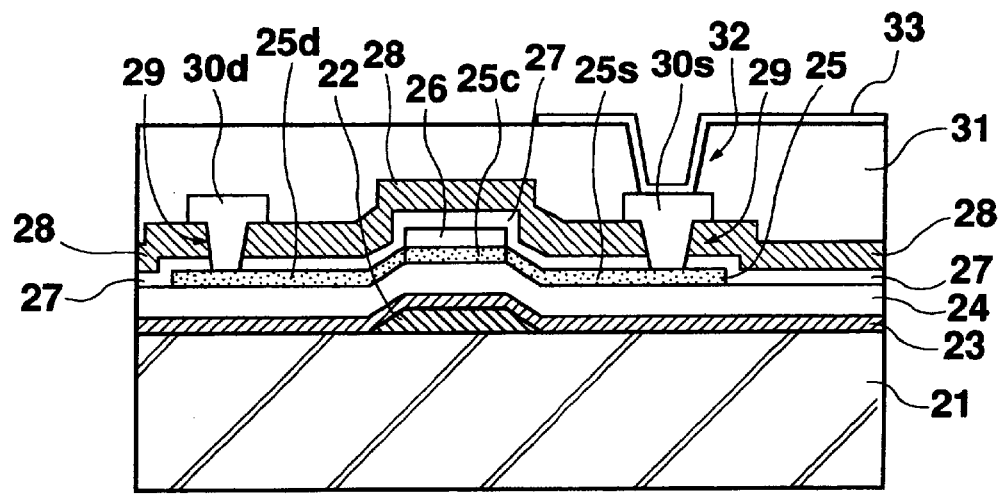
FIG. 2 is a cross sectional view showing the arrangement of a thin film transistor of the present invention.
Figure 3:
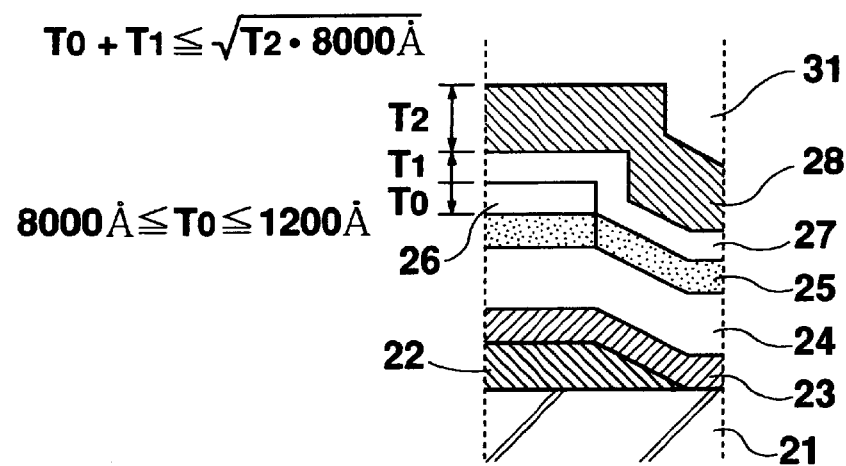
FIG. 3 is an enlarged view of the principal part of FIG. 2.

FIG. 2 is a cross sectional view showing the arrangement of a thin film transistor of the present invention, with FIG. 3 being an enlarged view of the principal portion thereof. In these figures, a transparent substrate 21, a gate electrode 22, a silicon nitride film 23, a silicon oxide film 24, and a polycrystalline silicon film 25 are equal to the transparent substrate 1, the gate electrode 2, the silicon nitride film 3, the silicon oxide film 4, and the polycrystalline silicon film 5, of a thin film transistor shown in FIG. 1.

On the surface of the transparent substrate 21, the gate electrode 22 is disposed, and covering this gate electrode 22, the silicon nitride film 23 and the silicon oxide film 24 as gate insulating films are deposited. Then, on the silicon oxide film 24, the polycrystalline silicon film 25 as a semiconductor film to be the active region is formed.

On the polycrystalline silicon film 25, a stopper 26 made of silicon oxide is disposed. Here, the stopper 26 is formed such that the film thickness T0 is 800 angstroms to 1200 angstroms (the most suitable value is 1000 angstroms). The polycrystalline silicon film 25 covered by this stopper 26 is a channel region 25c, and the other polycrystalline silicon film 25 is a source region 25s and a drain region 25d.

On the polycrystalline silicon film 25 to which the stopper 26 is formed, a silicon oxide film 27, which will not damage the polycrystalline silicon film 25 by contact, is deposited. On that silicon oxide film 27, a silicon nitride film 28 then, which includes hydrogen ions more than the hydrogen ions in the silicon oxide film 27 and becomes a main supply source of hydrogen ions, is deposited. Interlayer insulating films for protecting the polycrystalline silicon film 25 are formed by the silicon oxide film 27 and silicon nitride film 28. Here, the film thickness T1 of the silicon oxide 27 is set so that the value determined by adding the film thickness T0 of the stopper 26 to T1 may fulfill at least Expression 1, with the film thickness T2 of the silicon nitride film 28, and more preferably, so that the value may fulfill Expression 2.

$$T0+T1 \leq (T2 \times 8000 \text{ Å})^{1/2} \qquad (1)$$

$$T0+T1 \leq (T2 \times 4000 \text{ Å})^{1/2} \qquad (2)$$

That is, the supply of hydrogen ions (hydrogen atoms) depends on the film thickness of the silicon nitride film 28, and, if the film thickness of the silicon oxide 27 is set thin according to the supply, a sufficient amount of hydrogen ions can be supplied to the polycrystalline silicon film 25. According to Expression 1, for example, if the film thickness (=T2) of the silicon nitride film 28 is 3000 angstroms, the total film thickness (=T0+T1) of the stopper 26 and the silicon oxide film 27 may be set to a value not more than approximately 4900 angstroms (preferably, approximately 3500 angstroms). Furthermore, if the film thickness T0 of the stopper 26 is 1000 angstroms and the film thickness T1 of the silicon oxide film 27 is 1000 angstroms, it is necessary that the film thickness of the silicon nitride film 28 be not less than 500 angstroms (preferably, 1000 angstroms).

In the silicon oxide film 27 and the silicon nitride film 28 which are formed to have specified film thickness, contact holes 29 which reach the polycrystalline silicon film 25 are provided. Then, to the portions of these contact holes 29, a source electrode 30s and a drain electrode 30d are disposed to connect to the respective source region 25s and drain region 25d. Furthermore, an acrylic resin layer 31 is deposited on the silicon nitride film 28 to cover the source electrode 30s and the drain electrode 30d so that the surface may be flattened. Moreover, a contact hole 32 which reaches the source electrode 30s is provided in the acrylic resin layer 31; and a transparent electrode 33 to be connected to the source electrode 30s is disposed so as to spread over the acrylic resin layer 31. These source electrode 30s, drain electrode 30d, and transparent electrode 33 are equal to the source electrode 10s, drain electrode 10d, and transparent electrode 13, of a thin film transistor shown in FIG. 1.

In the above thin film transistor, the film thickness of the stopper 26 and the silicon oxide film 27 on the polycrystalline silicon film 25 is formed to be thin according to the film thickness of the silicon nitride film 28, and therefore, a sufficient number of the large quantity of hydrogen ions included in the silicon nitride film 28 are introduced into the polycrystalline silicon film 25 during the heat treatment process after the formation of these stopper 26, silicon oxide film 27, and silicon nitride film 28.

Figure 4:
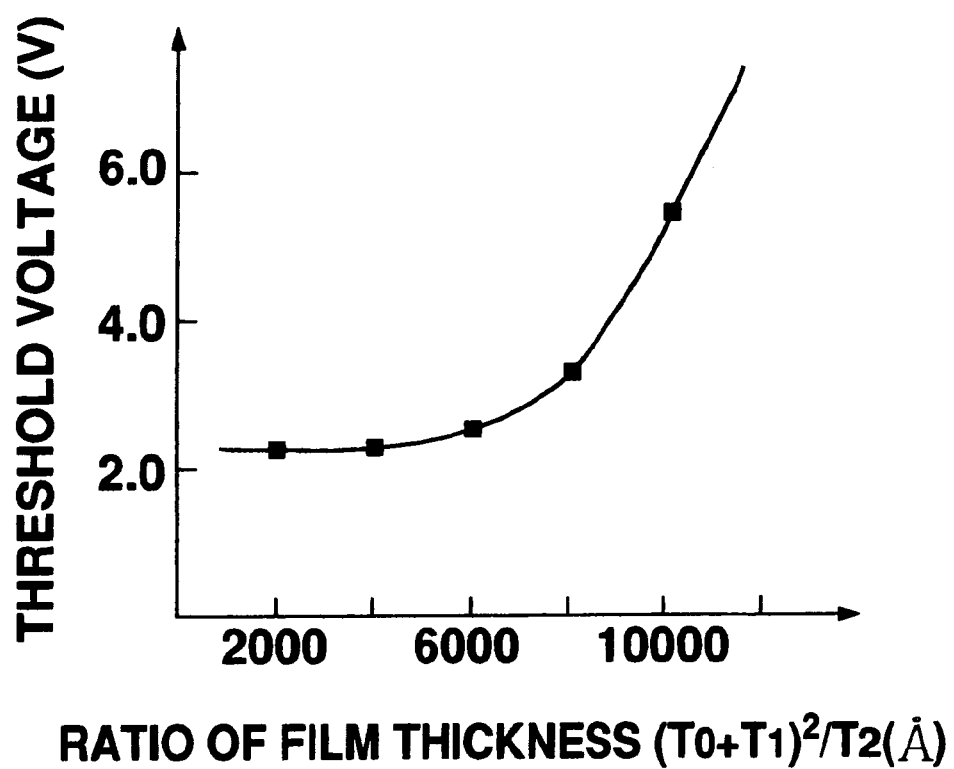
FIG. 4 is a figure showing the relation between the threshold value of a thin film transistor and the ratio in film thickness of the stopper to the interlayer insulating film.
Figure 5A:
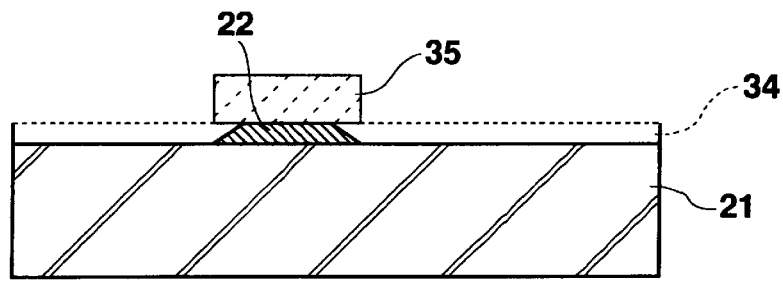
FIGS. 5A, 5B, 5C, 5D, 5E, and 5F are cross sectional views showing each step of the manufacturing method of a thin film transistor of the present invention.
Figure 5B:
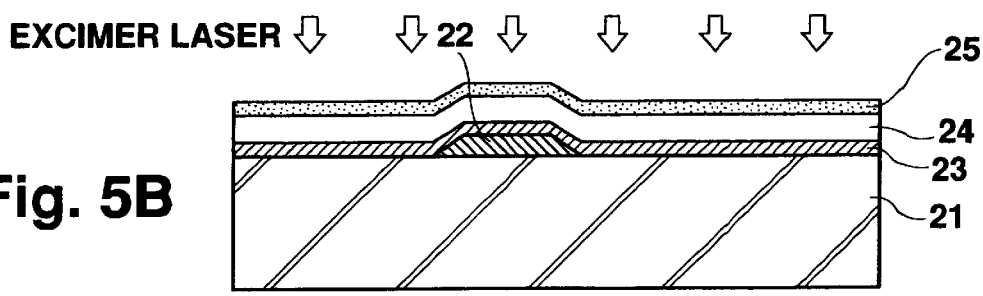
Figure 5C:
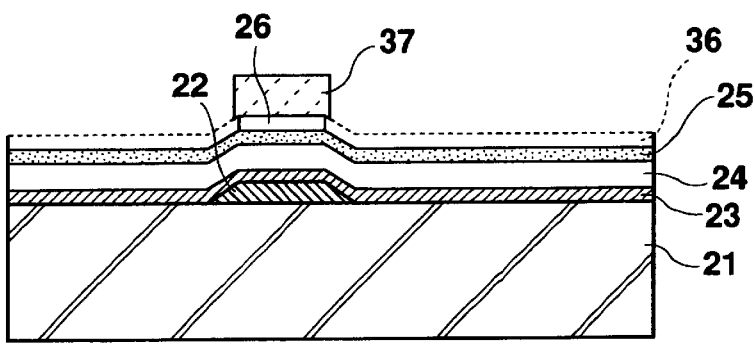
Figure 5D:
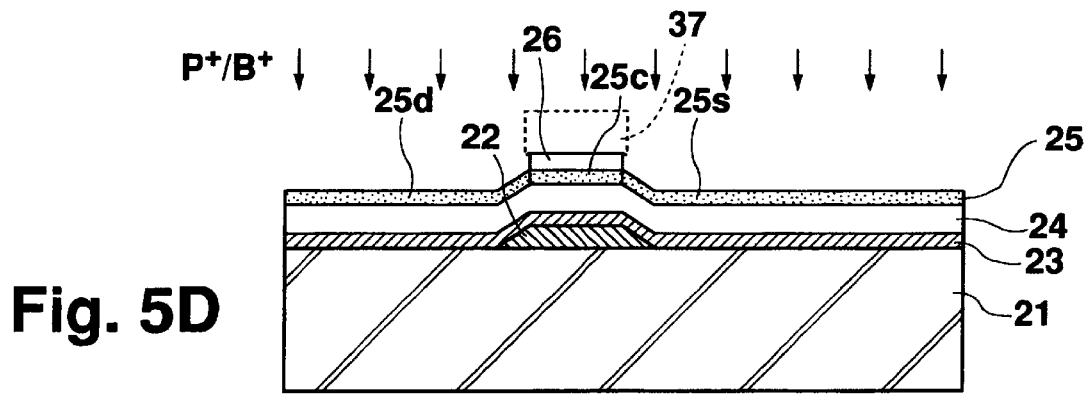
Figure 5E:
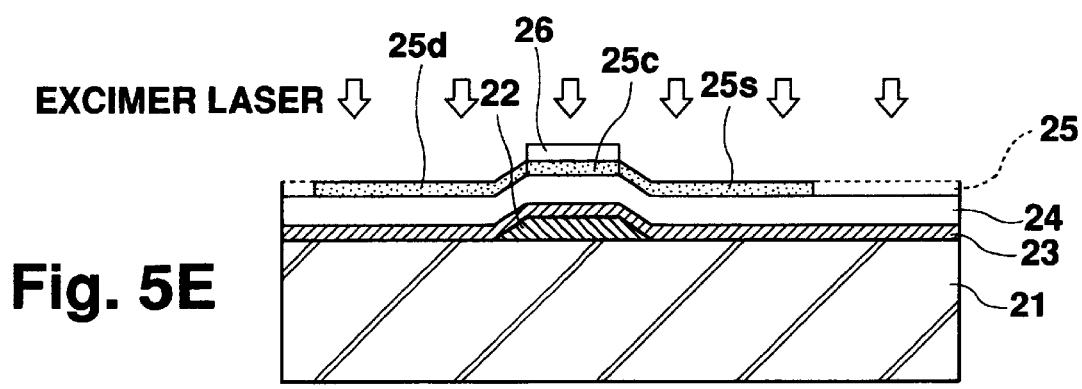
Figure 5F:
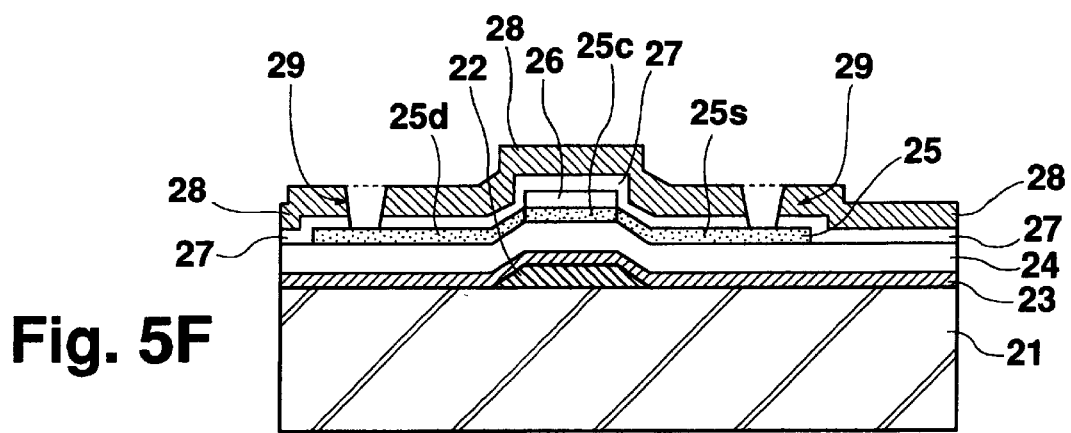

FIG. 4 is a figure showing how much the threshold voltage Vt of a thin film transistor, measured so to understand to what extent the crystal defects in the active region have been filled up, changes according to the ratio [(T0+T1)$^2$/T2] of the film thickness T2 of the silicon nitride film 28 to the square of the total film thickness (T0+T1) of the stopper 26 and the silicon oxide film 27.

This figure shows the measured values obtained by measuring the threshold voltage Vt of a thin film transistor at each step while gradually changing the component ratio [(T0+T1)$^2$/T2] of the films of the interlayer insulating film from approximately 2000 angstroms to approximately 10000 angstroms. From this measurement result, it can be seen that when [(T0+T1)$^2$/T2] is equal or less than 4000 angstroms, the threshold voltage Vt is relatively constant and stable. Furthermore, it has been confirmed that when [(T0+T1)$^2$/T2] is equal or less than 6000 angstroms, the fluctuation of the threshold voltage Vt is still small, but that when [(T0+T1)$^2$/T2] is between 8000 angstroms and 10000 angstroms, the threshold voltage Vt suddenly changes. From these results, it can be judged that a value of [(T0+T1)$^2$/T2] not more than 8000 angstroms is the minimum condition, and a value of [(T0+T1)$^2$/T2] equal or less than 4000 angstroms is the most suitable condition.

FIGS. 5A~5F are cross sectional views respectively describing Steps 5A~5F of the manufacturing method of a thin film transistor of the present invention. Each of these figures shows the section corresponding to that shown in FIG. 2.

(a) Step 5A

On the insulating transparent substrate 21, a metal with a relatively high melting point such as chromium, molybdenum, aluminum, aluminum alloy is deposited in a film thickness of 1000 angstroms by a spattering method or the like, so that a refractory metal film 34 may be formed. On this refractory metal film 34, a resist layer 35 with a specified pattern is formed, and by using this resist layer 35 as a mask, the refractory metal film 34 is etched, so that a gate electrode 22 may be formed. In the formation of this gate electrode, by the taper etching, both end portions of the gate electrode 22 are formed like a tapered shape so as to be wider on the transparent substrate 21 side.

(b) Step 5B

On the transparent substrate 21, silicon nitride is deposited by plasma CVD to form a film of not less than 500 angstroms. Silicon oxide is then deposited to create a film thickness of equal or less than 1300 angstroms. Consequently, the silicon nitride film 23 for preventing the precipitation of impurity ions from the transparent substrate 21 and the silicon oxide film 24 to be a gate insulating film, are formed. Then, on the silicon oxide film 23, also by plasma CVD, silicon is deposited in a film thickness of 400 angstroms, so that an amorphous silicon film (25a) may be formed. Then, by performing a heat treatment at approximately 430° C. for not less than 1 hour, the hydrogen in the silicon film (25a) is discharged out of the film, and after making the concentration of hydrogen not more than 1% (1 atms %), the silicon film (25a) is irradiated with an excimer laser, and is heated until the silicon in an amorphous state is melted. Consequently, the silicon crystallizes and forms the polycrystalline silicon film 25.

(c) Step 5C

On the polycrystalline silicon film 25, silicon oxide is deposited in a film thickness of 1000 angstroms using plasma CVD, so that a silicon oxide film 36 may be formed.

A resist layer 37 having a pattern corresponding to the gate electrode 22 is then formed on this silicon oxide film 36, and, by etching the silicon oxide film 36 by using this resist layer 37 as a mask, the stopper 26 overlapping with the gate electrode 22 is formed. By exposing the resist which is applied so as to cover the silicon oxide film 35, using the gate electrode as a mask from the back side of the transparent substrate 21, the resist layer 37 can be formed in such away that it is not shifted from the gate electrode 22. Furthermore, if the film thickness of the silicon oxide film 36 is approximately 1000 angstroms, the amount of etching of the side walls is small, even when the etching is performed in an isotropic way by using the resist layer 37 as a mask, so that the shape of the pattern of the stopper 26 can be accurately formed.

(d) Step 5D

Into the polycrystalline silicon film 25 to which the stopper 26 is formed, P type or N type ions corresponding to the type of a transistor to be formed, are doped. That is, when a channel P type transistor is formed, P type ions such as boron ions are doped as impurities, and in a case where a channel N type transistor is formed, N type ions such as phosphorus ions are doped. As a phosphorus ion is more permeable to silicon than a boron ion or the like, it is insufficient to use the stopper 26 alone as a mask for doping ions. Therefore, when phosphorus ions are doped, it is possible to prevent them from entering the channel region 25c when the resist layer 37 which has been used as an etching mask during the formation of the stopper 26 is left. By doping these ions, the source region 25s and the drain region 25d which show P type conductivity or N type conductivity, are formed to the polycrystalline silicon film 25 on both sides of the stopper 26.

(e) Step 5E

The polycrystalline silicon film 25 to which the source region 25s and the drain region 25d are formed, is irradiated with the excimer laser, and is heated to such an extent that the silicon is not melted. Consequently, the impurity ions in the source region 25s and the drain region 25d are activated. Then, the polycrystalline silicon film 25 is patterned like an island such that a specified width is left on the both sides, to the width of the formation of the stopper 26 (gate electrode 22), and a transistor is separated and isolated.

(f) Step 5F

On the polycrystalline silicon film 25, silicon oxide is deposited by plasma CVD in a film thickness of 1000 angstroms followed by silicon nitride with a film thickness of 3000 angstroms. Consequently, an interlayer insulating film comprising 2 layers of the silicon oxide film 27 and the silicon nitride film 28, is formed. Here, while the value determined by adding the film thickness T0 of the stopper 26 and the film thickness T1 of silicon oxide film 27 is 2000 angstroms, the film thickness T2 of the silicon nitride film 28 is 3000 angstroms, so that the above Expression 1 and Expression 2 may be fulfilled.

After the silicon oxide film 27 and the silicon nitride film 28 have been formed, heating is performed in a nitrogen atmosphere so that the hydrogen ions included in the silicon nitride film 28 may be introduced into the polycrystalline silicon film 25. It is necessary that the temperature of this heat treatment be in a range where the movement of hydrogen ions is sufficient and the transparent substrate 21 is not softened or melted, with the range of 350~450° C. being appropriate. Since the hydrogen ions included in the silicon nitride film 28 are introduced into the polycrystalline silicon film 25 through the silicon oxide film 27, which is formed to be thin according to the film thickness of the silicon nitride film 28, sufficient hydrogen ions in the polycrystalline silicon film 25 are assured. Consequently, the crystal defects in the polycrystalline silicon film 25 are filled with hydrogen ions.

After the filling of the crystal defects in the polycrystalline silicon film 25 with hydrogen ions is completed, the contact holes 29 which penetrate the silicon oxide film 27 and the silicon nitride film 28 are formed, corresponding to the source region 25s and the drain region 25d, and to the portions of these contact holes 29, the source electrode 30s and the drain electrode 30d made of a metal such as aluminum shown in FIG. 2 are formed. The formation of these source electrode 30s and drain electrode 30d is performed, for example, by patterning the aluminum spattered on the silicon nitride film 28 to which the contact holes 29 are formed.

Subsequently, onto the silicon nitride film 28 to which the source electrode 30s and the drain electrode 30d are formed, a solution of acrylic resin is applied and is baked so as to form the acrylic resin layer 31 in FIG. 2. This acrylic resin layer 31 fills up the unevenness resulting from the stopper 26, the source electrode 30s, and the drain electrode 30d so that the surface may be flattened. On the source electrode 30s, a contact hole 32 which penetrates the acrylic resin layer 31 is formed, and to the portion of this contact hole 32, the transparent electrode 33 which is made of ITO or the like and is connected to the source electrode 30s, is formed. The formation of this transparent electrode 33 is performed, for example, by patterning the ITO spattered on the acrylic resin layer 31 in which the contact hole 32 is formed.

As a product of the above steps, a bottom gate type thin film transistor having an arrangement shown in FIG. 2 is formed.

It should be understood that the film thicknesses described in the above examples are suitable values under specified conditions, but the present invention need not in way be limited to those values. If the film thickness T0 of the stopper 26 is in the range of 800 angstroms to 1200 angstroms, the shape of the pattern of the stopper can accurately be maintained during the etching of the stopper, without preventing the supply of hydrogen from the silicon nitride film to the polycrystalline silicon film. Furthermore, impurity doping into the channel region of the semiconductor film can be prevented.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A thin film transistor comprising: a gate electrode disposed on a substrate; a gate insulating film formed on said substrate so as to cover said gate electrode; a semiconductor film formed on said gate insulating film so as to lie across said gate electrode; a stopper disposed on said semiconductor film so as to overlap with said gate electrode; and an interlayer insulating film formed on said semiconductor film, said stopper made of a silicon oxide film having a film thickness of 800 angstroms to 1200 angstroms.

2. The thin film transistor according to claim 1, wherein a width of said stopper in the direction of the channel length is shorter than a width of said gate electrode in the same direction.

3. The thin film transistor according to claim 1, wherein said interlayer insulating film comprises a silicon oxide film which contacts said semiconductor film, and a silicon nitride film which is formed on the silicon oxide film.

4. The thin film transistor according to claim 3, wherein the total film thickness of said stopper and said silicon oxide film is set so as to be a value equal or less than the square root of a value determined by multiplying the film thickness of said silicon nitride by 8000 angstroms.

5. The thin film transistor according to claim 3, wherein the total film thickness of said stopper and said silicon oxide film is set so as to be a value equal or less than the square root of a value determined by multiplying the film thickness of said silicon nitride by 4000 angstroms.

* * * * *

UNITED STATES PATENT AND TRADEMARK OFFICE
CERTIFICATE OF CORRECTION

PATENT NO. : 6,191,452 B1
DATED : February 20, 2001
INVENTOR(S) : Oda et al.

It is certified that error appears in the above-identified patent and that said Letters Patent is hereby corrected as shown below:

Drawings,
Fig. 3, delete "8000Å≦To ≦ 1200Å" and insert therefor -- 800Å≦To≦ 1200Å --

Signed and Sealed this

Ninth Day of November, 2004

JON W. DUDAS
*Director of the United States Patent and Trademark Office*